United States Patent [19]
Assous et al.

[11] Patent Number: 5,682,335
[45] Date of Patent: Oct. 28, 1997

[54] METHOD AND DEVICE FOR SIMULTANEOUS IDENTIFICATION AND CORRECTION OF ERRORS IN THE MEASUREMENTS OF A MAGNETOMETER

[75] Inventors: Eric Charles Assous, Marseilles; Jean-Paul Petillon, Vitrolles, both of France

[73] Assignee: Eurocopter France, Marignane-Cedex, France

[21] Appl. No.: 631,703

[22] Filed: Apr. 9, 1996

[30] Foreign Application Priority Data

Apr. 10, 1995 [FR] France ................. 95 04241

[51] Int. Cl.$^6$ .................................................. G01C 21/00
[52] U.S. Cl. ........................ 364/571.02; 364/571.04; 364/559; 33/356; 33/318
[58] Field of Search ............... 364/571.02, 571.01, 364/571.04, 434, 559, 554; 324/225, 228, 244, 260, 261; 33/319, 333, 356, 357

[56] References Cited

U.S. PATENT DOCUMENTS

| | | | |
|---|---|---|---|
| 4,611,293 | 9/1986 | Hatch et al. | 364/571 |
| 4,660,161 | 4/1987 | Okada | 364/571.04 |
| 4,725,957 | 2/1988 | Alberter et al. | 364/457 |
| 4,808,923 | 2/1989 | Posseme | 324/244 |
| 4,845,856 | 7/1989 | Rochette | 33/318 |
| 4,870,602 | 9/1989 | Baumker | 364/571.02 |
| 4,972,593 | 11/1990 | Dahlen et al. | 33/356 |
| 5,001,647 | 3/1991 | Rapiejko et al. | 364/559 |
| 5,105,548 | 4/1992 | Fowler | 33/356 |
| 5,182,514 | 1/1993 | Rice, Jr. | 324/244 |
| 5,305,236 | 4/1994 | Germanetti | 33/356 |
| 5,321,631 | 6/1994 | Germanetti | 364/571.02 |
| 5,331,578 | 7/1994 | Stieler | 364/571.02 |
| 5,374,933 | 12/1994 | Kao | 364/449 |

FOREIGN PATENT DOCUMENTS

| | | |
|---|---|---|
| 0 226 653 A1 | 7/1987 | European Pat. Off. . |
| 2507 770 | 12/1982 | France . |
| 2128 749 | 5/1984 | United Kingdom . |

*Primary Examiner*—Emanuel T. Voeltz
*Assistant Examiner*—Bryan Bui
*Attorney, Agent, or Firm*—Marshall, O'Toole, Gerstein, Murray & Borun

[57] ABSTRACT

The present invention relates to a method and a device for correcting measurement errors of a magnetometer mounted on a vehicle. According to the method, a theoretical corrective model is defined in accordance with the following equation:

$$[A] \cdot Hm + \sum_{i=1}^{i=n} ([C]i \cdot [E]i) + Hp = [M] \cdot H,$$

where [A], [C]i and Hp are elements to be determined, Hm is the measured field, H the effective field, and [M] is a transformation matrix, and in which a vector error is defined in accordance with the following equation:

$$E = [M] \cdot H - \left( [A] \cdot Hm + \sum_{i=1}^{i=n} ([C]i \cdot [E]i) + Hp \right),$$

where the square of the error thus defined is determined and the coefficients of the model which minimize the sum of the squares of the error moduli for all the measurements taken are identified.

18 Claims, 3 Drawing Sheets

METHOD AND DEVICE FOR SIMULTANEOUS IDENTIFICATION AND CORRECTION OF ERRORS IN THE MEASUREMENTS OF A MAGNETOMETER

BACKGROUND OF THE INVENTION

The present invention relates to a method for simultaneous identification and correction of errors in the measurements of a magnetometer mounted on board a vehicle, as well as to a device for implementing this method and various systems using said device.

It is known that a magnetometer mounted on board a vehicle, in particular an aircraft, is generally subjected to various types of perturbations, for example magnetic perturbations and/or mechanical perturbations, which make the magnetic field measurements taken by this magnetometer inaccurate.

In order to obtain exact measurements, it is therefore necessary, if appropriate, to identify the errors generated by these perturbations and to correct them. Various methods are currently known for making such corrections.

However, these known methods are essentially intended only for correcting measurement errors due to magnetic perturbations, and do not make it possible to correct errors having other causes and/or due to non-magnetic perturbations.

Thus, for example, a first conventional method is known which is used for correcting measurement errors due to magnetic perturbations and which requires the magnetometer to be installed with precision on the vehicle in order to be used. According to this first known method, a magnetic perturbation model of the form $Hm=[B] \cdot H + H_B$ is defined, in which:

Hm represents the perturbed field measured by the magnetometer;

H represents the effective value of the magnetic field;

[B] is a symmetric matrix taking into account the perturbations generated by "soft irons", the absence of an antisymmetric part being due to the precise and suitable installation of the magnetometer on the vehicle; and $H_B$ represents a perturbing field due to the perturbations generated by "hard irons".

It will be noted that, in the absence of magnetic perturbations, the matrix [B] then representing the identity matrix and the perturbing field $H_B$ being zero, the modulus of the measured magnetic field is constant and the end describes a sphere. Under the effect of perturbations, this sphere is transformed into an off-center ellipsoid.

Said first known correction method recommends that the following operations be carried out:

taking a large number of measurements of the magnetic field during variations in the heading and the attitude of the vehicle;

determining the ellipsoid best corresponding to the measurements taken; and calculating, on the basis of the ellipsoid thus determined, the components of the matrix [B] and of the perturbing field $H_B$. The model then obtained makes it possible to calculate the effective field H on the basis of subsequent measurements taken by the magnetometer and subjected to magnetic perturbations.

However, as indicated above, this method requires a particular and very precise arrangement of the magnetometer on the vehicle, which requires specific and expensive manufacture and/or adjustment. In addition, the precision obtained by this method is unsatisfactory. These drawbacks are partially resolved by a second known method, which is subject to much less stringent constraints than the previous method with regard to the arrangement of the magnetometer on the vehicle. This second known method, which also makes it possible to correct only the measurement errors due to magnetic perturbations, is implemented in two successive steps:

in a first step, on the basis of a process similar to that of the previous method, a measurement is determined which conserves constancy of the norm of the field, said measurement being then affected only by a misalignment; and in a second step, the asymmetric component of the transformation matrix similar to the previous matrix [B] is determined on the basis of the variations in the vertical component of the magnetic field, this step being implemented by using attitude measurements.

This second known method has numerous drawbacks. In particular, implementing the two aforementioned steps presupposes a complex and lengthy maneuvering procedure of the vehicle, during which the measurements used are taken.

In order to remedy the drawbacks of the two aforementioned known methods, the Applicant Company has described, in Patent Application 94 15231 filed on 19 Dec. 1994, a method for correcting measurement errors of a magnetometer. However, this advantageous method makes it possible only to correct errors due to magnetic perturbations, as well as errors due to poor alignment of the reference coordinate system of the magnetometer, relative, to the reference coordinate system of the vehicle.

There is therefore currently no known method making it possible to correct errors due, at least in part, to types of perturbations other than those described above.

SUMMARY OF THE INVENTION

The object of the present invention is to overcome this lack in the prior art. It relates to a method making it possible to correct, generally and very precisely, errors due to determined and varied perturbations in the measurements of a magnetometer mounted on board a vehicle, in particular an aircraft.

To this end, according to the invention, said method is noteworthy in that:

a theoretical model correcting the measurement errors of the magnetometer is defined in the form:

$$Hc = [A] \cdot Hm + \sum_{i=1}^{i=n} ([C]i \cdot [E]i) + Hp,$$

n being an integer greater than or equal to 1, in which:

Hc is the corrected field,

[A] is a matrix to be determined,

Hm is the value measured by the magnetometer of the magnetic field in a reference frame associated with said vehicle, the elements [C]i are matrices to be determined, with respective dimensions (3×mi), mi being an integer greater than or equal to 1, the elements [E]i are matrices with respective dimensions (mi×1), the coefficients of which are measurements of perturbing parameters or combinations of such measurements, and Hp is a perturbing field to be determined;

the corrected field Hc is assumed to be the terrestrial field defined in the vehicle reference frame, so that:

$$[A] \cdot Hm + \sum_{i=1}^{i=n} ([C]i \cdot [E]i) + Hp = [M] \cdot H$$

with:
H the effective value of the magnetic field in a base reference frame, and
[M] a change of frame matrix from said base reference frame to said vehicle reference frame;
successive measurements Hm of the magnetic field are taken using the magnetometer during movements of the vehicle;
the coefficients of the various matrices [E]i are determined on the basis of the measurements of the perturbing parameters, taken simultaneously with the Hm measurements;
the coefficients of the change of frame matrix [M] are determined;
an error vector E with components Ex, Ey and Ez is defined, defined by the equation:

$$E = [M] \cdot H - \left( [A] \cdot Hm + \sum_{i=1}^{i=n} ([C]i \cdot [E]i) + Hp \right)$$

a composite error $E^2 = Ex^2 + Ey^2 + Ez^2$ is defined;
a system of equations formed by m equations of the type $(\partial \Sigma E^2)/\partial cl = 0$, $l=1$ to m, $(\partial \Sigma E^2)/\partial cl$ corresponding to the partial derivative of the sum of the composite errors $\Sigma E^2$ is defined, for all the measurements, with respect to a coefficient cl, the various coefficients cl representing the coefficients to be determined in said theoretical model, namely the coefficients of the matrix [A], of the matrices [C]i and of the vector Hp, as well as at least one component of the effective magnetic field H;
said system of equations is solved so as to obtain said coefficients cl, including said component of the effective magnetic field H; and
the corrective model obtained on the basis of said coefficients is used to correct the errors due to determined perturbations in the measurements of said magnetometer.

Thus, by virtue of the invention, a general method is obtained which makes it possible to identify and correct very precisely measurement errors of a magnetometer which are due to varied and multiple perturbations, as will be seen in more detail below with reference to various particularly advantageous embodiments.

Further, by virtue of the invention, the corrective model is determined in a single step, which leads to simplified implementation, in particular as regards the vehicle maneuvering procedure during which the measurements are taken.

In addition, the method according to the invention makes it possible to determine, simultaneously with calculation of said corrective model, at least one component of the effective magnetic field in the base reference frame.

It will be noted that the calculations carried out during implementation of the method are simplified in the case when only a single component of said magnetic field is determined.

Indeed, in embodiments for which only the vertical component of the magnetic field is determined, $E^2 = Ez^2$ is advantageously used as composite error, so that only the coefficients of the third row of the matrix $[M]^{-1}$ are used, said matrix $[M]^{-1}$ being the change of frame matrix from said vehicle reference frame to said base reference frame, said coefficients being determined on the basis of the longitudinal and transverse attitudes of said vehicle.

On the other hand, in the embodiments for which all three components of the magnetic field are determined, coefficients of the matrix [M] are advantageously determined on the basis of the longitudinal and transverse attitudes, as well as on the basis of the heading of said vehicle.

Advantageously, the heading value used in this case may correspond either to a geographical heading value or to a heading value affected by an arbitrary constant error, such as that delivered by a free gyroscopic mode attitude and heading unit.

In order to demonstrate clearly the variety and multiplicity of corrections which are possible by virtue of the method according to the invention, several particularly advantageous embodiments are presented below, it being possible for these various embodiments to be produced simultaneously during a single implementation of said method.

By way of example, the present invention makes it possible to correct measurement errors of the magnetometer which are due to mechanical perturbations, in particular deformations of the element supporting the magnetometer, which may modify the alignment of the latter, which then causes measurement errors.

Firstly, in the case where the magnetometer is mounted on a supporting element, of the helicopter tail boom type, capable of being deformed while it is subjected to variable mechanical stresses, according to the invention, in order to identify and correct the errors due to such deformations in the measurements of the magnetometer, the product of a matrix [C] of dimension (3,5) and a matrix [E] of dimension (5,1) are advantageously introduced into the theoretical model, such that:

$$[C] = \begin{bmatrix} 0 & -Cez & 0 & 0 & Cey \\ Cez & 0 & -Cex & 0 & 0 \\ 0 & Cex & 0 & -Cey & 0 \end{bmatrix}$$

and $$[E] = \begin{bmatrix} Fv \cdot Hmx \\ Fv \cdot Hmy \\ Fv \cdot Hmz \\ Fh \cdot Hmx \\ Fh \cdot Hmz \end{bmatrix}$$

with:

Fv: the lateral force generated on the supporting element,
Fh: the vertical force generated on the supporting element,
Cex: the torsional elasticity coefficient of the supporting element,
Cey: the pitch flexional elasticity coefficient of the supporting element,
Cez: the yaw flexional elasticity coefficient of the supporting element, and
Hmx, Hmy and Hmz: the respective components of the measured field Hm in the vehicle reference frame.

Secondly, in the case where the magnetometer is mounted on an airplane wing, for example of a transport airplane, according to the invention, in order to identify and correct the errors due to an alignment defect of the magnetometer caused by flapping of said wing, the product of the following elements is advantageously introduced into the theoretical model:

$$[C] = \begin{bmatrix} 0 & 0 \\ -Cox & 0 \\ 0 & Cox \end{bmatrix} \text{ and } [E] = \begin{bmatrix} Pz \cdot Hmz \\ Pz \cdot Hmy \end{bmatrix}$$

in which:

Cox is the flapping elasticity coefficient of said wing,

Pz is the lift of said wing, which is advantageously defined by the equation Pz=M·gz, M being the mass of the vehicle and qz the vertical load factor, and Hmy and Hmz are the values of the lateral and vertical components of the measured magnetic field Hm.

Further to taking into account magnetic perturbations, such as those presented above, the present invention also makes it possible to remedy the potentially detrimental consequences of other types of perturbations, in particular perturbations of magnetic origin, as specified below.

Thus, for example, in the case where said vehicle is a helicopter whose rotor has residual magnetization, according to a particularly advantageous embodiment of the invention, in order to identify and correct the errors due to variations in the magnetic perturbations caused by said magnetized rotor subjected to high mechanical stresses, the product of the following elements is advantageously introduced into the theoretical model:

$$[C] = \begin{bmatrix} Hcx \\ Hcy \\ Hcz \end{bmatrix} \text{ and } [E] = Cr,$$

Cr being the rotor torque and Hcx, Hcy and Hcz proportionality coefficients to be determined.

Moreover, advantageously, in order to identify and correct the errors due to magnetic perturbations generated by the presence of at least one equipment item that consumes direct current in proximity to said magnetometer, the product of the following elements is introduced into the theoretical model:

$$[C] = \begin{bmatrix} Hix \\ Hiy \\ Hiz \end{bmatrix} \text{ and } [E] = I,$$

I being the direct current consumed by said equipment and Hix, Hiy and Hiz proportionality coefficients to be determined.

In addition, an advantageous embodiment of the invention makes it possible to identify and correct a linearity defect in the measurements of the magnetometer along at least one of the three possible measurement axes of said magnetometer.

To this end, according to the invention, a polynomial approximation of the nonlinear function reproducing this linearity defect is determined and, in order to identify the corrective term of a harmonic $n$ in said polynomial approximation, the product of the following elements is introduced into the theoretical model:

$$[C] = \begin{bmatrix} axn & 0 & 0 \\ 0 & ayn & 0 \\ 0 & 0 & azn \end{bmatrix} \text{ and } [E] = \begin{bmatrix} Hmx^n \\ Hmy^n \\ Hmz^n \end{bmatrix}$$

with:

axn, ayn and azn coefficients, to be determined, representing the respective amplitudes, along the three measurement axes of the magnetometer, of the nonlinearity corrections of order $n$; and $Hmx^n$, $Hmy^n$ and $Hmz^n$, the $n^{th}$ powers of the respective components of the measured field Hm along the three measurement axes of the magnetometer.

During implementation of the method according to the invention, it has been assumed that the magnetic field is constant for all the magnetic field measurements taken. This assumption is, however, not always satisfied in practice. Thus, an advantageous embodiment of the invention makes it possible to determine the local variations of the components of the terrestrial magnetic field, which makes it possible to improve the precision of the corrective model obtained by the present invention.

To this end, according to the invention, the product of a matrix [C], the coefficients of which represent the various gradients of said components of the terrestrial magnetic field, and a matrix [E], the coefficients of which are calculated on the basis of the coefficients of the change of frame matrix [M] and on the basis of the position in a determined reference frame of said vehicle during measurements by the magnetometer, is introduced into the theoretical model.

Finally, a last embodiment of the invention makes it possible to identify and correct the biases of gyrometers, the measurements of which are used, in particular, for determining the coefficients of the matrix [M], which clearly demonstrates the diversity of possible implementations of the invention, which is not limited just to correcting errors due to magnetic and/or mechanical perturbations such as those specified above.

According to this last embodiment, advantageously the product of the following elements is introduced into the theoretical model:

$$[C] = \begin{bmatrix} 0 & -\Delta wz & \Delta wy \\ \Delta wz & 0 & -\Delta wx \\ -\Delta wy & \Delta wx & 0 \end{bmatrix} \text{ and } [E] = \begin{bmatrix} Hmx \cdot t \\ Hmy \cdot t \\ Hmz \cdot t \end{bmatrix}$$

in which:

$\Delta wx$, $\Delta wy$ and $\Delta wz$ are the biases of said gyrometers to be determined, Hmx, Hmy and Hmz are the respective components of the measured field Hm in the vehicle reference frame, and $t$ is the time at which the measurement is taken.

The present invention also relates to a device for implementing the aforementioned method.

According to the invention, said device is noteworthy in that it includes:

a first calculation module receiving available data regarding said vehicle and capable of determining, on the basis of these data, the coefficients of the matrices [E]i;

a second calculation module capable of calculating the coefficients of the change of frame matrix [M], which are useful for implementing the invention, on the basis of the attitudes and, if necessary, the heading of the vehicle; and a main calculation module, connected to said first and second calculation modules, as well as to the magnetometer, and capable of determining said corrective model and said effective magnetic field.

It will be noted that the present invention further relates to two systems including the device according to the invention, namely, on the one hand, an aircraft on-board attitude and heading reference system including a magnetometer used for correcting a possible drift in the heading measurement, and, on the other hand, an aircraft inertial unit associated with a magnetometer.

In the attitude and heading reference system, the device according to the invention is used to correct the measurement errors of said magnetometer, whereas, in the inertial unit, said device is used to determine the terrestrial magnetic field, in precise fashion, in collaboration with said magnetometer as well as to correct the measurement errors of said magnetometer.

The figures of the appended drawing will clearly demonstrate how the invention may be embodied. In these figures, identical references denote similar elements.

DETAILED DESCRIPTION OF PREFERRED EMBODIMENT

Figure 1:
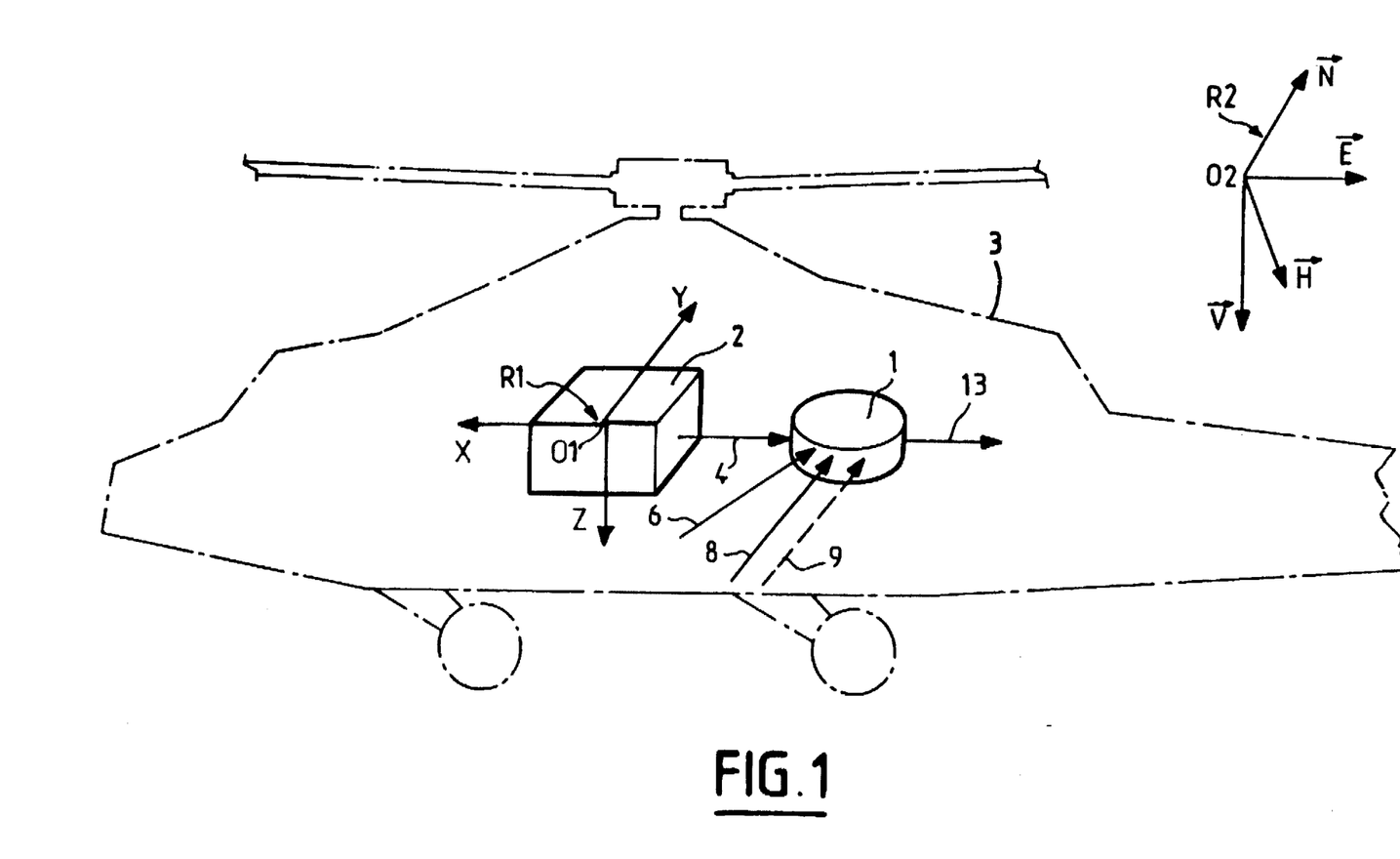
FIG. 1 schematically shows a vehicle including a device according to the invention.

The device 1 according to the invention is intended to correct errors in the measurements of a magnetometer 2 mounted on board a vehicle 3, which is schematically represented in the form of a helicopter in FIG. 1.

The magnetometer 2 can measure, in a reference frame R1 which is associated with said vehicle 3, the components of a directional magnetic physical quantity with locally constant amplitude, represented by a vector, such as the vector H aligned, in the example represented, with the gradient of the terrestrial magnetic potential. The magnetic field Hm measured by said magnetometer 2 satisfies the equation Hm=[M]·H, in which H represents the effective value of the magnetic field in a base reference frame R2 and [M] represents the change of frame matrix from said base reference frame R2 to said vehicle reference frame R1.

Said base reference frame R2 may, for example, be formed by three axes $\vec{V}$, $\vec{N}$ and $\vec{E}$ defined as follows:

$\vec{V}$ is an axis parallel to the gradient of the terrestrial gravitational field, pointing toward the center of the earth, and giving the local vertical;

$\vec{N}$ is a horizontal axis giving the geographical or directional north; and $\vec{E}$ is an axis giving east, as represented in FIG. 1.

As is known, change from one of these reference frames R1 and R2 to the other requires three successive rotations defined by the Euler angles $\psi$, $\theta$ and $\Phi$, not represented, in which:

$\psi$ is the heading angle, $\theta$ is the longitudinal attitude angle, and $\Phi$ is the transverse attitude angle.

These three rotations are written in the form of the conventional Euler angle matrix, that is to say the change of frame matrix $[M]^{-1}$ permitting change from the reference frame R1 to the reference frame R2, defined as follows:

$$[M]^{-1} = \begin{vmatrix} \cos\psi \cdot \cos\theta & \cos\psi \cdot \sin\theta \cdot \sin\Phi - \sin\psi \cdot \cos\Phi & \sin\psi \cdot \sin\Phi + \cos\psi \cdot \sin\theta \cdot \cos\Phi \\ \sin\psi \cdot \cos\theta & \cos\psi \cdot \cos\Phi + \sin\psi \cdot \sin\theta \cdot \sin\Phi & \sin\psi \cdot \sin\theta \cdot \cos\Phi - \cos\psi \cdot \sin\Phi \\ -\sin\theta & \cos\theta \cdot \sin\Phi & \cos\theta \cdot \cos\Phi \end{vmatrix}$$

However, such a magnetometer 2 is often subject to various perturbations, for example mechanical perturbations or magnetic perturbations, so that the measurements taken have errors.

The device 1 according to the invention is intended to identify simultaneously all the existing errors, regardless of the origins of these errors, and to correct them.

A description is given below of a first embodiment of the invention, making it possible to determine simultaneously:

a corrective model making it possible to identify and correct all the errors appearing in the measurements of the magnetometer 2; and all three components of the magnetic field H in the base reference frame.

To this end, a theoretical model correcting the measurement errors of the magnetometer is first of all defined in the form:

$$Hc = [A] \cdot Hm + \sum_{i=1}^{i=n} ([C]i \cdot [E]i) + Hp \tag{1}$$

$n$ being an integer greater than or equal to 1, in which, in addition to the aforementioned element Hm:

Hc is the corrected field,

[A] is a matrix to be determined, taking into account the so-called "soft iron" perturbations and the misalignments, without angular limitation;

the elements [C]i are matrices to be determined, with respective dimensions (3×mi), $mi$ being an integer greater than or equal to 1, the elements [E]i are matrices with respective dimensions (mi×1), the coefficients of which are measurements of perturbing parameters or combinations of such measurements, as specified below and Hp is a perturbing field to be determined.

Thus, the theoretical model includes the sum of matrix products:

$$\sum_{i=1}^{i=n} ([C]i \cdot [E]i) = ([C]1 \cdot [E]1) + ([C]2 \cdot [E]2) + \ldots + ([C]n \cdot [E]n)$$

with:

$$[C]i = \begin{bmatrix} c11 & c12 & \ldots & c1mi \\ c21 & c22 & \ldots & c2mi \\ c31 & c32 & \ldots & c3mi \end{bmatrix}_i$$

and $$[E]i = \begin{bmatrix} E1 \\ E2 \\ \cdot \\ \cdot \\ \cdot \\ Emi \end{bmatrix}_i$$

The corrected field Hc is considered to be the terrestrial field defined in the vehicle reference frame, so that:

$$[A] \cdot Hm + \sum_{i=1}^{i=n} ([C]i \cdot [E]i) + Hp = [M] \cdot H \quad (2)$$

Next, during maneuvers of said vehicle 3, successive measurements of the magnetic field are taken using the magnetometer 2, and heading and attitude measurements are taken using a suitable system such as, for example, a free gyroscopic mode attitude and heading unit (not shown) mounted on said vehicle 3, as well as, if appropriate, that is to say if they are necessary for implementing the invention, measurements making it possible to determine the coefficients of the elements [E]i, as specified below with reference to particular embodiments.

These maneuvers may correspond, for example for an aircraft, to two turns, to the right and then to the left, of 360° with a roll of the order of 30°.

The attitude and optionally heading measurements are used to calculate the change of frame matrix [M] as defined above.

The above expression (2) for the theoretical model can be written in the form of the following system:

$$\sum_{j=1}^{j=p} (\alpha j) = R_{11} \cdot Hn + R_{12} \cdot He + R_{13} \cdot Hv$$

$$\sum_{j=1}^{j=p} (\beta j) = R_{21} \cdot Hn + R_{22} \cdot He + R_{23} \cdot Hv$$

$$\sum_{j=1}^{j=p} (\gamma j) = R_{31} \cdot Hn + R_{32} \cdot He + R_{33} \cdot Hv$$

in which:

the terms $R_{pq}$ (p=1, 2, 3 and q=1, 2, 3) are the coefficients of the matrix [M];

Hn, He and Hv are the components of the vector H;

the sums of the terms ($\alpha j$), of the terms ($\beta j$) and of the terms ($\gamma j$) are the left-hand terms, respectively, of the three lines in said expression (2); and $$p = \sum_{i=1}^{i=n} (mi) + 4$$

It will be noted that this system can only be determined to within a multiplicative constant. In order to raise the indeterminacy, it is possible to divide the various equations by a coefficient appearing in each of them, for example Hn, He or Hv. However, since the coefficients He and Hv may have very low values in certain regions of the terrestrial globe, which risks posing calculation problems, said equations are preferably by divided Hn, so as to obtain the following system:

$$\sum_{j=1}^{j=p} (\alpha j)/(Hn) = R_{11} + R_{12} \cdot he + R_{13} \cdot hv$$

$$\sum_{j=1}^{j=p} (\beta j)/(Hn) = R_{21} + R_{22} \cdot he + R_{23} \cdot hv$$

$$\sum_{j=1}^{j=p} (\gamma j)/(Hn) = R_{31} + R_{32} \cdot he + R_{33} \cdot hv$$

with he=He/Hn and hv=Hv/Hn.

The error vector E with components Ex, Ey and Ez, defined by the equation:

$$E = [M] \cdot H - \left( [A] \cdot Hm + \sum_{i=1}^{i=n} ([C]i \cdot [E]i) + Hp \right)$$

is then considered.

However, in order to make it possible to use the above system, a modified error vector $\epsilon$ with components $\epsilon x$, $\epsilon y$ and $\epsilon z$ satisfying the equation $\epsilon = E/Hn$ is determined.

A composite error of the form $E^2 = Ex^2 + Ey^2 + Ez^2$ or of the form $\epsilon^2 = \epsilon x^2 + \epsilon y^2 + \epsilon z^2$ is determined on the basis of said components.

Next, a system of equations formed by $m$ equations of the type $(\partial \Sigma \epsilon^2)/\partial cl = 0$, l=1 to m, or of the type $(\partial \Sigma E^2)/\partial cl = 0$, $(\partial \Sigma \epsilon^2)/\partial cl$ (corresponding to the partial derivative of the sum of the composite errors $\Sigma \epsilon^2$, for all the measurements, with respect to a coefficient cl, the various coefficients cl representing the coefficients to be determined in said theoretical perturbation model, namely the coefficients of the matrix [A], of the $n$ matrices [C]i and of the vector Hp, as well as the components of the effective magnetic field H; and said system of equations is solved by a numerical method.

Finally, in order to recover coefficients with exact dimensions, all the coefficients obtained above are further divided by a suitable divisor, namely, for example, the term Q11=(A11)/Hn.

The coefficients obtained then constitute the corrective model making it possible to determine the exact values of the magnetic field on the basis of field values measured by the magnetometer 2, that is to say to correct the errors of said measured field values.

The embodiment of the invention described above therefore makes it possible to determine simultaneously said corrective model and all three components of the terrestrial magnetic field.

A simplified embodiment which does not use a heading reference, and only makes it possible to determine, in addition to said corrective model, the vertical component Hv of said terrestrial magnetic field, is described below.

To this end, the expression (2) of the theoretical model is written in the form:

$$[M]^{-1} \cdot \left( [A] \cdot Hm + \sum_{i=1}^{i=n} ([C]i \cdot [E]i) + Hp \right) = H$$

that is to say:

$$[M]^{-1} \cdot \begin{vmatrix} \sum_{j=1}^{j=p} (\alpha j) \\ \sum_{j=1}^{j=p} (\beta j) \\ \sum_{j=1}^{j=p} (\gamma j) \end{vmatrix} = \begin{vmatrix} Hn \\ He \\ Hv \end{vmatrix}$$

In the present assumed case, the components Hn and He of the effective magnetic field H are inaccessible because of the absence of a heading reference. Consequently, only the third equation of the above system can be analyzed for the purposes of identifying a component of the magnetic field, said third equation being written:

$$R_{31}{}^* \cdot \left( \sum_{j=1}^{j=p} (\alpha j) \right) + R_{32}{}^* \cdot \left( \sum_{j=1}^{j=p} (\beta j) \right) + R_{33}{}^* \cdot \left( \sum_{j=1}^{j=p} (\gamma j) \right) = Hv$$

$R_{31}{}^*$, $R_{32}{}^*$ and $R_{33}{}^*$ are the three components of the third row of the change of frame matrix $[M]^{-1}$ defined above, that is to say:

$R_{31}^* = -\sin\Theta$ $R_{32}^* = \cos\Theta \cdot \sin\Phi$ $R_{33}^* = \cos\Theta \cdot \cos\Phi$.

These coefficients $R_{31}^*$, $R_{32}^*$ and $R_{33}^*$ are therefore defined only on the basis of attitude angles $\Theta$ and $\Phi$, and not on the basis of the heading angle $\psi$.

As in the previous embodiment, this equation has an infinite number of solutions differing by a multiplicative constant. In order to raise the indeterminacy which exists, both terms of the equation are divided by Hv.

It will be noted that, in this case, only the component $\epsilon z$ of the error vector $\epsilon$ is determined. A system of equations formed by equations of the type $(\partial\Sigma\epsilon z^2)/\partial cl=0$, is then defined, the coefficients cl again representing the coefficients to be determined of the theoretical model (1), and this system is solved in the usual way.

The coefficients thus calculated are divided by a suitable divisor in order to obtain the correct dimensions and the desired corrective model.

Implementation is therefore identical to that presented above.

Figure 2:
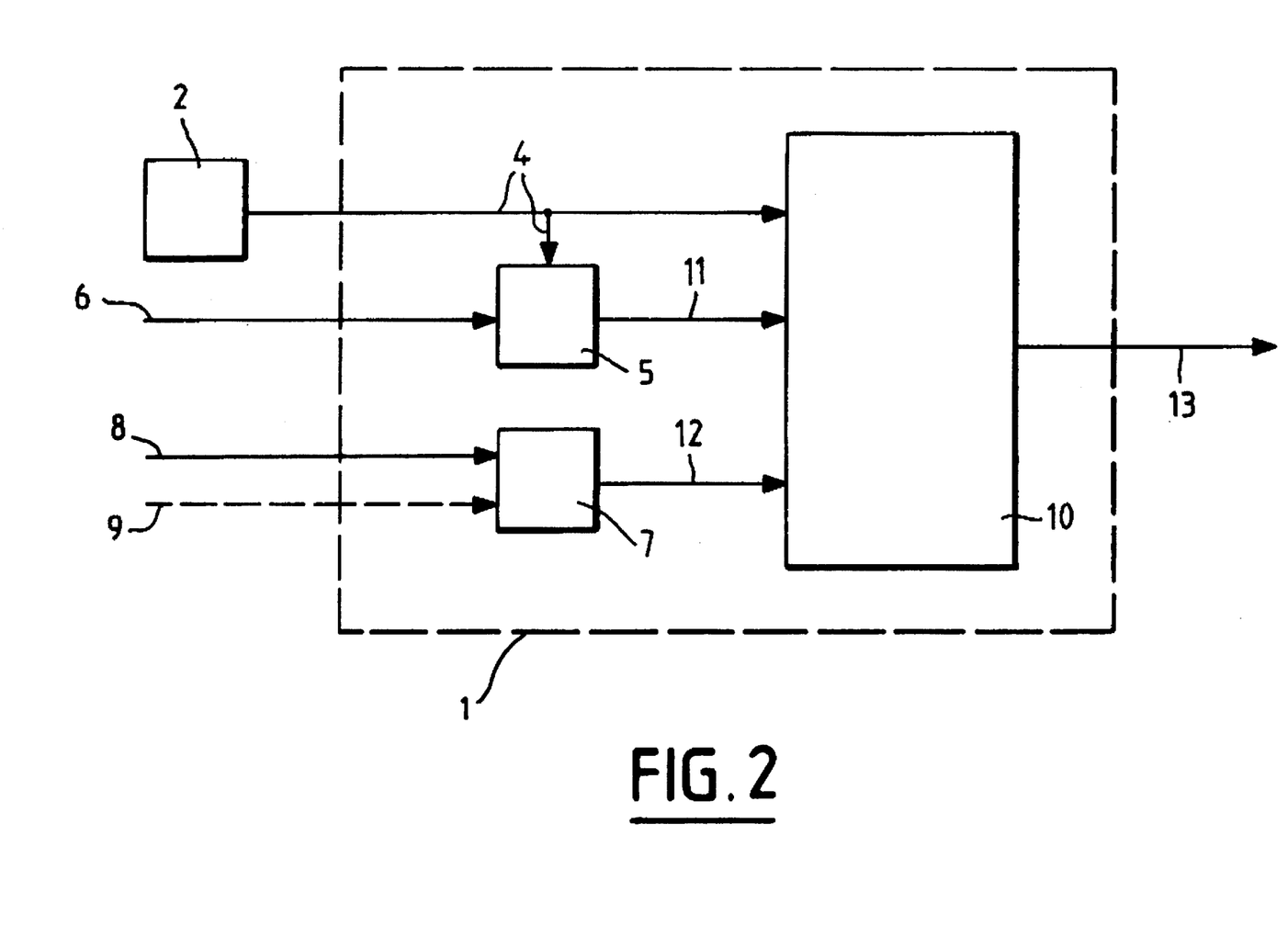
FIG. 2 is the block diagram of the device according to the invention.

For these embodiments of the method according to the invention, the device 1, which is connected by a link 4 to the magnetometer 2, includes, according to the invention and as represented in FIG. 2:

- a calculation module 5, connected to the magnetometer 2 by said link 4 and receiving, via a multiple link 6, available data regarding the vehicle 3 and specified hereafter for particular embodiments, said calculation module 5 being capable of determining the coefficients of the matrices [E]i;

- a calculation module 7 receiving, from a suitable device (not shown), on the one hand, the values of the attitudes of the vehicle 3 via a link 8 and, on the other hand, if appropriate, that is to say if it is necessary for implementing the invention, the value of the heading of the vehicle 3 via a link 9, said calculation module 7 being capable of calculating the coefficients of the change of frame matrix [M] which are used during implementation of the invention; and

- a main calculation module 10 connected to said calculation modules 5 and 7 and said magnetometer 2, respectively via links 11 and 12 and the link 4, said main calculation module 10 being capable of determining said corrective model and said effective magnetic field and being capable of transmitting the results obtained via a link 13, for example to a user device (not shown).

It will be noted that the calculation module 5 is connected, in particular, to measuring devices and/or to sensors which supply it, via the multiple link 6, with specific data, specified below, which are processed by said calculation module 5. However, in some cases, as will also be seen below, the available data correspond per se to the desired coefficients of the matrices [E]i, so that the calculation module 5 is then used only to transmit these data to the main calculation module 10.

Of course, said main calculation module 10 and said calculation modules 5 and 7 can be installed either in a single computer or in different computers.

Before specifying various particularly advantageous embodiments of the invention, it should further be noted that the device 1 according to the invention can advantageously be used by varied types of systems (not shown) on board said vehicle 3.

For example, an aircraft attitude and heading reference system including, among other things, a magnetometer for correcting a possible drift in the heading, can use the device 1 to correct the errors due to multiple and varied perturbations in the measurements of said magnetometer.

In addition, an aircraft inertial unit, associated with a magnetometer, can use the device 1 according to the invention to determine, in precise fashion, in collaboration with said magnetometer, the declination and inclination of the terrestrial magnetic field, as well as to correct the measurement errors of said magnetometer.

Various advantageous embodiments are now presented, making it possible to demonstrate clearly the multiplicity of possible uses of the invention. Although these various embodiments are specified one after the other below, they can of course be implemented simultaneously.

Thus, the present invention is particularly well suited to the correction of measurement errors of the magnetometer which are due to deformations of the supporting element on which said magnetometer is mounted. Such deformations can cause slight displacements of the magnetometer, causing in particular an alignment defect of the reference coordinate system of the latter relative to the reference coordinate system of the vehicle, which constitutes a source of errors.

Figure 3:
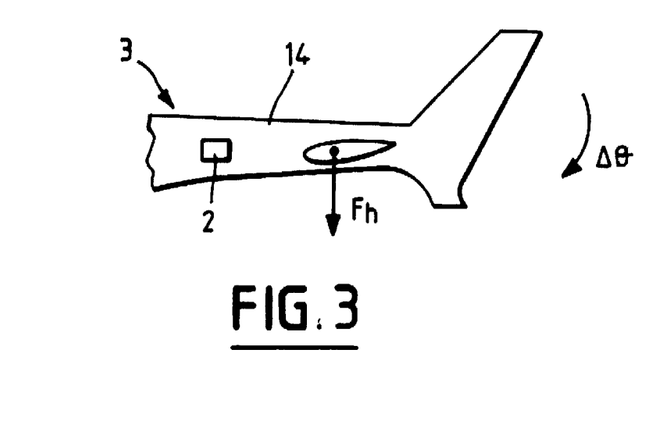
FIG. 3 is a side view of a helicopter tail boom supporting a magnetometer.
Figure 4:
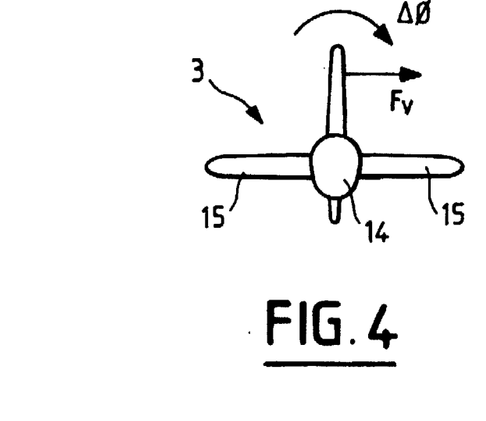
FIG. 4 is a transverse view of the tail boom in FIG. 3.
Figure 5:
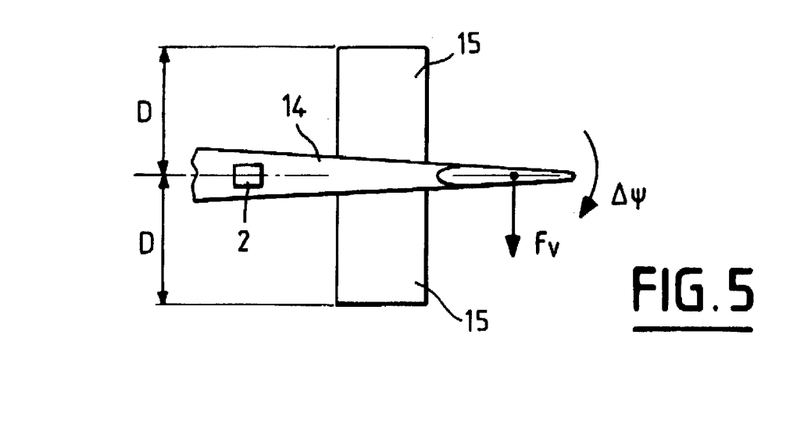
FIG. 5 is a plan view of the tail boom in FIG. 3.

It is known that, in the case of a helicopter 3, the magnetometer 2 is generally mounted in the tail boom 14, as represented in FIGS. 3 to 5, so as to be as far as possible away from the main electrical and electronic equipment and the heavy components of the helicopter 3, which can perturb said magnetometer 2. However, since the tail boom 14 is not perfectly rigid, it deforms under the effect of the mechanical stresses to which it is subjected, which can lead to an alignment defect of said magnetometer 2.

It is also known that an attitude alignment error has a doubled effect on the heading error, in the case of a 60° terrestrial field inclination, as existing, for example, in France. Since the observed deformations are of the order of 0.2°, the resulting heading error is of the order of 0.4°, this value corresponding approximately to the desired performance of current attitude and heading reference units. Such an error is therefore non-negligible.

Generally, the tail boom 14 is subjected to a lateral force Fv. The main rotor torque of the helicopter 3 then causes, on the tail boom 14:

on the one hand, a yaw flexion $\Delta\psi$ represented in FIG. 5 and satisfying the equation $\Delta\psi = Cez \cdot Fv$, Cez being the yaw flexional elasticity coefficient of the tail boom 14; and on the other hand, a roll torsion $\Delta\Phi$ represented in FIG. 4 and satisfying the equation $\Delta\Phi = Cex \cdot Fv$, Cex being the torsional elasticity coefficient of the tail boom 14.

In addition, in the case of a helicopter whose empennage 15 has lateral symmetry, that is to say with identical left and right wingspans, with length D, as represented in FIG. 5, the vertical force (or lift) Fh of this empennage causes a pitch flexion $\Delta\Theta$ represented in FIG. 3 and satisfying the equation $\Delta\Theta = Cey \cdot Fh$, Cey being the pitch flexional elasticity coefficient of the tail boom 14.

Consequently, the values $\Delta\psi$, $\Delta\Theta$, $\Delta\Phi$ represent the angular variations in the position of the magnetometer, respectively in yaw, pitch and roll, in the case when the tail boom 14 is subjected to the aforementioned stresses, relative to the position existing when the tail boom 14 is unstressed.

According to the invention, in order to identify and correct the errors due to such deformations in the measurements of the magnetometer, the product of the matrix [C] of dimension (3,5) and the matrix [E] of dimension (5,1) is introduced into the theoretical model (1), such that:

$$[C] = \begin{bmatrix} 0 & -Cez & 0 & 0 & Cey \\ Cez & 0 & -Cex & 0 & 0 \\ 0 & Cex & 0 & -Cey & 0 \end{bmatrix}$$

and $$[E] = \begin{bmatrix} Fv \cdot Hmx \\ Fv \cdot Hmy \\ Fv \cdot Hmz \\ Fh \cdot Hmx \\ Fh \cdot Hmz \end{bmatrix}$$

with Hmx, Hmy and Hmz the respective components of the measured field Hm in the vehicle reference frame R1.

Consequently, the coefficients of the matrix [C] are determined by the method according to the invention, and those of the matrix [E] by the calculation module 5 on the basis of measurements taken in known fashion. To this end, said calculation module 5 is connected via a link (not shown) to the magnetometer 2 in order to receive said components of the measured field Hm.

The product [C]·[E] therefore constitutes a correction vector for measurement errors of the magnetic field which are caused by the aforementioned stresses.

This correction vector can be defined, in order clearly to explain the precision of the correction obtained, on the basis of a matrix [Msd] making it possible to change from the position of the magnetometer 2 when the tail boom 14 is unstressed to the position of said magnetometer 2 when said tail boom 14 is stressed. This matrix is equal to:

$$[Msd] = \begin{bmatrix} 1 & -\Delta\psi & \Delta\theta \\ \Delta\psi & 1 & -\Delta\Phi \\ -\Delta\theta & \Delta\Phi & 1 \end{bmatrix}$$

so that the corrected field Hc is then written, according to the expression (2) specified above of the theoretical model, Hc=[Msd]·[M]·H When the infinitely small second order contributions are neglected, the following term remains:

$$\begin{bmatrix} 0 & -\Delta\psi & \Delta\theta \\ \Delta\psi & 0 & -\Delta\Phi \\ -\Delta\theta & \Delta\Phi & 0 \end{bmatrix} \cdot H$$

which corresponds to:

$$\begin{bmatrix} 0 & -Cez \cdot Fv & Cey \cdot Fh \\ Cez \cdot Fv & 0 & -Cex \cdot Fv \\ -Cey \cdot Fh & Cex \cdot Fv & 0 \end{bmatrix} \cdot \begin{bmatrix} Hmx \\ Hmy \\ Hmz \end{bmatrix} = [C] \cdot [E]$$

These explanations make it possible to specify what is represented by the correction vector, obtained by the method according to the invention and capable of being applied essentially in the case of a helicopter whose tail boom supports the magnetometer.

On the other hand, in the case of an airplane (not shown), for example a transport airplane, the magnetometer is generally installed at the end of a wing, also in order to be as far away as possible from perturbing elements. Now, because of the elasticity of the structure of said wing, it can be deformed, which may also cause an alignment defect of the magnetometer.

The main deformation which exists and is taken into account in the present invention is the flapping deformation of said wing $\Delta\Phi^*$.

This flapping deformation $\Delta\Phi^*$, which is due to the lift Pz of the wing, is written $\Delta\Phi^*$=Cox·Pz, Cox being the flapping elasticity coefficient of the wing.

According to the invention, in order to identify and correct the errors due to an alignment defect of the magnetometer caused by flapping of the wing supporting said magnetometer, the product of the following elements is introduced into the theoretical model (1):

$$[C] = \begin{bmatrix} 0 & 0 \\ -Cox & 0 \\ 0 & Cox \end{bmatrix} \text{ and } [E] = \begin{bmatrix} Pz \cdot Hmz \\ Pz \cdot Hmy \end{bmatrix}$$

in which:

M represents the mass of the airplane, which can be determined on the basis of the initial mass of said airplane, the fuel consumption and, if appropriate, load drops; and gz is the vertical load factor which can be measured by an accelerometer of the attitude and heading reference system or the inertial unit of the airplane.

These data are, of course, transmitted via the link 6 to the calculation module 5 which can calculate the coefficients of said matrix [E].

It will be noted that the product [C]·[E] satisfies the equation:

$$[C] \cdot [E] = \begin{bmatrix} 0 & 0 & 0 \\ 0 & 0 & -Cox \cdot M \cdot gz \\ 0 & Cox \cdot M \cdot gz & 0 \end{bmatrix} \cdot \begin{bmatrix} Hmx \\ Hmy \\ Hmz \end{bmatrix}$$

which makes it comparable with the aforementioned solution in the case of a helicopter.

Two advantageous embodiments have just been described above which make it possible to correct measurement errors of the magnetometer which are due to mechanical perturbations, namely deformations of the supporting element. Several embodiments will now be described below which make it possible to correct errors due to various perturbations of magnetic origin.

One particularly advantageous embodiment which is applicable to a helicopter makes it possible to remedy the magnetic instabilities caused by the rotor of the helicopter which, on the one hand, has residual magnetization and, on the other hand, is subjected to high mechanical stresses.

Since, in the manufacturing phase, the rotor of a helicopter generally undergoes non-destructive testing of the magnetoscopic type, it does indeed often have residual magnetization.

Now, as is known, a magnetized ferromagnetic material subjected to high stresses has its magnetic state vary reversibly and proportionately to the applied stresses.

This phenomenon, applied to the case of a helicopter rotor, can cause magnetic perturbations that can generate non-negligible measurement errors in the case of a small helicopter on which the magnetometer may not be sufficiently far from the rotor mast.

According to the invention, in order to identify and correct such errors, the product of the following elements is introduced into the theoretical model (1) of the method according to the invention:

$$[C] = \begin{bmatrix} Hcx \\ Hcy \\ Hcz \end{bmatrix} \text{ and } [E] = Cr,$$

Cr being the rotor torque and Hcx, Hcy and Hcz proportionality coefficients to be determined by said method, so as to obtain a correction vector defined by said product $[C]\cdot[E]$.

Another embodiment of the invention makes it possible to identify and correct the errors due to magnetic perturbations generated by the presence of equipment that consumes direct current in proximity to said magnetometer. It is known that, generally, the two cables of an electrical supply are routed as close as possible to each other or are twisted so that the area of the circuit thus formed is as small as possible and the flow of current does not generate a magnetic field. However, such assembly precautions are not always possible, so that a perturbing magnetic field then appears.

According to the invention, in order to correct such a perturbing field, a corrective term $[C]\cdot[E]$ is determined, with:

$$[C] = \begin{bmatrix} Hix \\ Hiy \\ Hiz \end{bmatrix} \text{ and } [E] = I,$$

I being the direct current consumed by said equipment item (not shown) and Hix, Hiy and Hiz being proportionality coefficients determined by the invention.

Of course, in this case, a device, connected to the calculation module 5, for measuring the current I is necessary for implementing the invention.

The measurement errors may, moreover, arise from a linearity defect of the magnetic field measurement and acquisition channels of the magnetometer. It is known that the operation of a magnetometer is generally based on the compensation of the field to be measured by a direct current, so that the material constituting the core of the sensors of the magnetometer always functions with respect to the same magnetization state which, in principle, guarantees fairly good linearity. However, in practice, for some particular operating conditions this linearity is sometimes not satisfied.

Thus, in order to correct the measurement errors which can be caused by such a linearity defect, according to the invention a polynomial approximation of the nonlinear function reproducing this linearity defect is determined, and, in order to obtain the corrective term of a harmonic $\underline{n}$ in said polynomial approximation, the product of the following elements is introduced into the theoretical model (1) of the method according to the invention:

$$[C] = \begin{bmatrix} axn & 0 & 0 \\ 0 & ayn & 0 \\ 0 & 0 & azn \end{bmatrix} \text{ and } [E] = \begin{bmatrix} Hmx^n \\ Hmy^n \\ Hmz^n \end{bmatrix}$$

with:
- axn, ayn and azn coefficients, to be determined, representing the respective amplitudes, along the three possible measurement axes of the magnetometer 2, of the nonlinearity corrections of order $\underline{n}$; and
- $Hmx^n$, $Hmy^n$ and $Hmz^n$, the $n^{th}$ powers of the respective components of the measured field Hm along the three measurement axes of the magnetometer.

Of course, in the method according to the invention, specified above, it has been assumed that the measured magnetic field is constant throughout the various maneuvers of the vehicle executed in order to implement said method. This is generally satisfied in practice, since:

- the executed maneuvers are limited, for example, to two turns with 30° roll, to the left and to the right, so that the area of ground covered by the vehicle is not too great; and
- the variation in the terrestrial field is, in most regions of the terrestrial globe, negligible for the positional variations obtained by such maneuvers.

However, in some regions of the terrestrial globe, the variations in the magnetic field may not be negligible, when the area of ground covered during the measurements is relatively great, which may lead to errors in the corrective model obtained. In the present invention, only linear variations in said magnetic field are taken into account.

Thus, according to the invention, in order to determine the linear local variations in the components of the terrestrial magnetic field, making it possible to improve the precision of the corrective model, the product of a matrix [C], the coefficients of which represent the various gradients of said components of the magnetic field, and a matrix [E], the coefficients of which are defined on the basis of the coefficients of the change of frame matrix [M] and on the basis of the position in a determined reference frame of the vehicle 3 during measurements by the magnetometer 2, is introduced into the theoretical model.

Moreover, the terrestrial magnetic field H, the variations of which are locally linear, can be written in the form:

$$H = \begin{bmatrix} gnn & gne & gnv \\ gen & gee & gev \\ gvn & gve & gvv \end{bmatrix} \cdot \begin{bmatrix} pn \\ pe \\ pv \end{bmatrix} + \begin{bmatrix} Hn0 \\ He0 \\ Hv0 \end{bmatrix}$$

in which:
- (pn, pe, pv) represents the position vector of the vehicle 3 in a determined reference frame defined relative to an initial position (0, 0, 0), for example the position at the start of the measurements;
- the row vectors of the matrix (3×3) are gradients, respectively, of the three components of the terrestrial magnetic field; and
- (Hn0, He0, Hv0) is the terrestrial field at said initial position (0, 0, 0), so that:

$$[M]\cdot H = [M]\cdot\left(\begin{bmatrix} gnn & gne & gnv \\ gen & gee & gev \\ gvn & gve & gvv \end{bmatrix}\cdot\begin{bmatrix} pn \\ pe \\ pv \end{bmatrix} + \begin{bmatrix} Hn0 \\ He0 \\ Hv0 \end{bmatrix}\right)$$

$$= [M]\cdot\left(\begin{bmatrix} gnn & gne & gnv \\ gen & gee & gev \\ gvn & gve & gvv \end{bmatrix}\cdot\begin{bmatrix} pn \\ pe \\ pv \end{bmatrix}\right) + [M]\cdot\begin{bmatrix} Hn0 \\ He0 \\ Hv0 \end{bmatrix}$$

The following corrective term is derived from this expression:

$$\begin{bmatrix} R_{11} & R_{12} & R_{13} \\ R_{21} & R_{22} & R_{23} \\ R_{31} & R_{32} & R_{33} \end{bmatrix}\cdot\begin{bmatrix} gnn & gne & gnv \\ gen & gee & gev \\ gvn & gve & gvv \end{bmatrix}\cdot\begin{bmatrix} pn \\ pe \\ pv \end{bmatrix}$$

which makes it possible to recover, by simple matrix transcription, the product $[C]\cdot[E]$ defined above:

$$[C] \cdot [E] = - \begin{bmatrix} R_{11} & R_{12} & R_{13} \\ R_{21} & R_{22} & R_{23} \\ R_{31} & R_{32} & R_{33} \end{bmatrix} \cdot \begin{bmatrix} gnn & gne & gnv \\ gen & gee & gev \\ gvn & gve & gvv \end{bmatrix} \cdot \begin{bmatrix} pn \\ pe \\ pv \end{bmatrix}$$

The matrix [C] appears in the form given below, having 3 rows and 27 columns.

$$[c] = \begin{vmatrix} gnn\ gne\ gnv\ gen\ gee\ gev\ gvn\ gve\ gvv\ 0\ 0\ 0\ 0\ 0\ 0\ 0\ 0\ 0\ 0\ 0\ 0\ 0\ 0\ 0\ 0\ 0\ 0 \\ 0\ 0\ 0\ 0\ 0\ 0\ 0\ 0\ 0\ gnn\ gne\ gnv\ gen\ gee\ gev\ gvn\ gve\ gvv\ 0\ 0\ 0\ 0\ 0\ 0\ 0\ 0\ 0 \\ 0\ 0\ 0\ 0\ 0\ 0\ 0\ 0\ 0\ 0\ 0\ 0\ 0\ 0\ 0\ 0\ 0\ 0\ gnn\ gne\ gnv\ gen\ gee\ gev\ gvn\ gve\ gvv \end{vmatrix}$$

For its part, the matrix [E] has 1 column and 27 rows, as below:

$$[E] = \begin{vmatrix} R_{11}pn \\ R_{11}pe \\ R_{11}pv \\ R_{12}pn \\ R_{12}pe \\ R_{12}pv \\ R_{13}pn \\ R_{13}pe \\ R_{13}pv \\ R_{21}pn \\ R_{21}pe \\ R_{21}pv \\ R_{22}pn \\ R_{22}pe \\ R_{22}pv \\ R_{23}pn \\ R_{23}pe \\ R_{23}pv \\ R_{31}pn \\ R_{31}pe \\ R_{31}pv \\ R_{32}pn \\ R_{32}pe \\ R_{32}pv \\ R_{33}pn \\ R_{33}pe \\ R_{33}pv \end{vmatrix}$$

Moreover, the present invention makes it possible to identify and correct the biases of gyrometers used, in particular, to determine the coefficients of the change of frame matrix [M] from the base reference frame R2 to the vehicle reference frame R1.

The embodiment in question applies, more precisely, to the gyrometric biases which are fixed in the vehicle reference frame R1, such as, for example, the gyrometric biases which may exist in the measurements taken by a linked-component inertial unit.

To this end, according to the invention, in order to identify and correct such gyrometric biases, the product of the following elements is introduced into the theoretical model (1):

$$[C] = \begin{bmatrix} 0 & -\Delta wz & \Delta wy \\ \Delta wz & 0 & -\Delta wx \\ -\Delta wy & \Delta wx & 0 \end{bmatrix} \text{ and } [E] = \begin{bmatrix} Hmx.t \\ Hmy.t \\ Hmz.t \end{bmatrix}$$

in which:

$\Delta wx$, $\Delta wy$ and $\Delta wz$ are the biases of said gyrometers to be determined; and $t$ is the time at which the measurement is taken.

The gyrometric bias corrections thus made make it possible, in particular, to improve the corrective model determined by the method according to the invention. They also make it possible to use on the vehicle 3 medium performance and low cost gyrometers for which the measurement precision is limited because of the existence of biases, since by virtue of the invention it is possible to correct such gyrometric biases.

The various advantageous embodiments described above make it possible to demonstrate clearly the multiplicity of possible corrections and the numerous advantages of the present invention. These various embodiments can, of course, be produced simultaneously, on the basis of a single implementation of the method according to the invention, in the case where the magnetometer is subjected to all the perturbations mentioned above. It will further be noted that the invention is clearly not limited to these particular embodiments, but encompasses all the identifications and corrections of errors in the measurements of a magnetometer which can be carried out by the method according to the invention.

We claim:

1. A method for identifying and correcting errors due to determined perturbations in the measurements of a magnetometer (2) mounted on board a vehicle (3), wherein:

a theoretical model correcting the measurement errors of the magnetometer is defined in the form:

$$Hc = [A] \cdot Hm + \sum_{i=1}^{i=n} ([C]i \cdot [E]i) + Hp,$$

n being an integer greater than or equal to 1, in which:

Hc is the corrected field,

[A] is a matrix to be determined,

Hm is the value measured by the magnetometer (2) of the magnetic field in a reference frame (R1) associated with said vehicle (3), the elements [C]i are matrices to be determined, with respective dimensions (3×mi), mi being an integer greater than or equal to 1, the elements [E]i are matrices with respective dimensions (mi×1), the coefficients of which are measurements of perturbing parameters or combinations of such measurements, and Hp is a perturbing field to be determined;

the corrected field Hc is assumed to be the terrestrial field defined in the vehicle reference frame, so that:

$$[A] \cdot Hm + \sum_{i=1}^{i=n} ([C]i \cdot [E]i) + Hp = [M] \cdot H$$

with:

H representing the effective value of the magnetic field in a base reference frame (R2), and

[M] representing a change of frame matrix from said base reference frame (R2) to said vehicle reference frame (R1);

successive measurements Hm of the magnetic field are taken using the magnetometer during movements of the vehicle;

the coefficients of the various matrices [E]i are determined on the basis of the measurements of the perturbing parameters, taken simultaneously with the Hm measurements;

the coefficients of the change of frame matrix [M] are determined;

an error vector E with components Ex, Ey and Ez is defined, defined by the equation:

$$E = [M] \cdot H - \left( [A] \cdot Hm + \sum_{i=1}^{i=n} ([C]i \cdot [E]i) + Hp \right)$$

a composite error $E^2 = Ex^2 + Ey^2 + Ez^2$ is defined;

a system of equations formed by m equations of the type $(\partial \Sigma E^2)/\partial c1 = 0$, $1 = 1$ to m, $(\partial \Sigma E^2)/\partial c1$ corresponding to the partial derivative of the sum of the composite errors $\Sigma E^2$ is defined, for all the measurements, with respect to a coefficient cl, the various coefficients cl representing the coefficients to be determined in said theoretical model, namely the coefficients of the matrix [A], of the matrices [C]i and of the vector Hp, as well as at least one component of the effective magnetic field H;

said system of equations is solved so as to obtain said coefficients cl, including said component of the effective magnetic field H; and the corrective model obtained on the basis of said coefficients is used to correct the errors due to determined perturbations in the measurements of said magnetometer (2).

2. The method as claimed in claim 1, for determining only the vertical component of the magnetic field, wherein $E^2 = Ez^2$ is used as composite error, so that only the coefficients of the third row of the matrix $[M]^{-1}$ are used, said matrix $[M]^{-1}$ being the change of frame matrix from said vehicle reference frame (R1) to said base reference frame (R2), said coefficients being determined from the attitudes of said vehicle (3).

3. The method as claimed in claim 1, for determining all three components of the magnetic field, wherein the coefficients of the matrix [M] are determined on the basis of the attitudes as well as on the basis of the heading of said vehicle (3).

4. The method as claimed in claim 3, wherein said heading is a geographical heading.

5. The method as claimed in claim 3, wherein said heading is a heading delivered by a free gyroscopic mode attitude and heading unit.

6. The method as claimed in claim 1, the magnetometer (2) being mounted on a supporting element (14) capable of being deformed when the mechanical stresses acting on said supporting element vary, wherein, in order to identify and correct the errors due to such deformations in the measurements of the magnetometer (2), the product of a matrix [C] of dimension (3,5) and a matrix [E] of dimension (5,1) are introduced into the theoretical model, such that:

$$[C] = \begin{bmatrix} 0 & -Cez & 0 & 0 & Cey \\ Cez & 0 & -Cex & 0 & 0 \\ 0 & Cex & 0 & -Cey & 0 \end{bmatrix}$$

and $$[E] = \begin{bmatrix} Fv.Hmx \\ Fv.Hmy \\ Fv.Hmz \\ Fh.Hmx \\ Fh.Hmz \end{bmatrix}$$

with:

Fv: the lateral force generated on the supporting element (14),

Fh: the vertical force generated on the supporting element (14),

Cex: the torsional elasticity coefficient of the supporting element (14),

Cey: the pitch flexional elasticity coefficient of the supporting element (14),

Cez: the yaw flexional elasticity coefficient of the supporting element (14), and Hmx, Hmy and Hmz: the respective components of the measured field Hm in the vehicle reference frame (R1).

7. The method as claimed in claim 6, said vehicle being a helicopter (3), wherein the supporting element of the magnetometer (2) is the tail boom (14) of said helicopter (3).

8. The method as claimed in claim 1, said vehicle being an airplane and the magnetometer being mounted on a wing of said airplane, wherein, in order to identify and correct the errors due to an alignment defect of the magnetometer caused by flapping of said wing supporting said magnetometer, the product of the following elements is introduced into the theoretical model:

$$[C] = \begin{bmatrix} 0 & 0 \\ -Cox & 0 \\ 0 & Cox \end{bmatrix} \text{ and } [E] = \begin{bmatrix} Pz.Hmz \\ Pz.Hmy \end{bmatrix}$$

in which:

Cox is the flapping elasticity coefficient of said wing,

Pz is the lift of said wing, and

Hmy and Hmz are the values of the lateral and vertical components of the measured magnetic field Hm.

9. The method as claimed in claim 8, wherein the lift Pz is determined on the basis of the equation $Pz = M \cdot gz$, with M representing the mass of the vehicle and gz representing the vertical load factor.

10. The method as claimed in claim 1, said vehicle being a helicopter whose rotor has residual magnetization, wherein, in order to identify and correct the errors due to variations in the magnetic perturbations caused by said magnetized rotor subjected to high mechanical stresses, the product of the following elements is introduced into the theoretical model:

$$[C] = \begin{bmatrix} Hcx \\ Hcy \\ Hcz \end{bmatrix} \text{ and } [E] = Cr,$$

Cr being the rotor torque and Hcx, Hcy and Hcz proportionality coefficients to be determined.

11. The method as claimed in claim 1, wherein, in order to identify and correct the errors due to magnetic perturbations generated by the presence of at least one equipment item that consumes direct current in proximity to said magnetometer (2), the product of the following elements is introduced into the theoretical model:

$$[C] = \begin{bmatrix} Hix \\ Hiy \\ Hiz \end{bmatrix} \text{ and } [E] = I,$$

I being the direct current consumed by said equipment and Hix, Hiy and Hiz proportionality coefficients to be determined.

12. The method as claimed in claim 1, wherein, in order to identify and correct a linearity defect in the measurements of the magnetometer (2) along at least one of the three possible measurement axes of said magnetometer (2), a polynomial approximation of the nonlinear function reproducing this linearity defect is determined, and wherein, in order to identify the corrective term of a harmonic n in said polynomial approximation, the product of the following elements is introduced into the theoretical model:

$$[C] = \begin{bmatrix} axn & 0 & 0 \\ 0 & ayn & 0 \\ 0 & 0 & azn \end{bmatrix} \text{ and } [E] = \begin{bmatrix} Hmx^n \\ Hmy^n \\ Hmz^n \end{bmatrix}$$

with:

axn, ayn and azn coefficients, to be determined, representing the respective amplitudes, along the three measurement axes of the magnetometer (2), of the nonlinearity corrections of order n; and $Hmx^n$, $Hmy^n$ and $Hmz^n$, the $n^{th}$ powers of the respective components of the measured field Hm along the three measurement axes of the magnetometer (2).

13. The method as claimed in claim 1, wherein, in order to determine the local variations in the components of the terrestrial magnetic field, making it possible to improve the precision of the corrective model, the product of a matrix [C], the coefficients of which represent the various gradients of said components of the terrestrial magnetic field, and a matrix [E], the coefficients of which are calculated on the basis of the coefficients of the change of frame matrix [M] and on the basis of the position in a determined reference frame of said vehicle (3) during measurements by the magnetometer (2), is introduced into the theoretical model.

14. Method as claimed in claim 1, wherein, in order to identify and correct the biases of gyrometers, the measurements of which are used, in particular, for determining the coefficients of the matrix [M], the product of the following elements is introduced into the theoretical model:

$$[C] = \begin{bmatrix} 0 & -\Delta wz & \Delta wy \\ \Delta wz & 0 & -\Delta wx \\ -\Delta wy & \Delta wx & 0 \end{bmatrix} \text{ and } [E] = \begin{bmatrix} Hmx.t \\ Hmy.t \\ Hmz.t \end{bmatrix}$$

in which:

$\Delta wx$, $\Delta wy$ and $\Delta wz$ are the biases of said gyrometers to be determined, Hmx, Hmy and Hmz are the respective components of the measured field Hm in the vehicle reference frame (R1), and t is the time at which the measurement is taken.

15. A device for implementing the method specified under claim 1, which includes:

a first calculation module (5), receiving available data regarding said vehicle (3) and capable of determining, on the basis of these data, the coefficients of the matrices [E]i;

a second calculation module (7) capable of calculating the coefficients of the change of frame matrix [M], which are useful for implementing the invention, on the basis of the attitudes and, if necessary, the heading of the vehicle (3); and a main calculation module (10), connected to said first and second calculation modules (5, 7), as well as to the magnetometer (2), and capable of determining said corrective model and at least one component of the effective magnetic field.

16. The device as claimed in claim 15, wherein said main calculation module (10) and said first and second calculation modules (5, 7) are installed in different computers.

17. An aircraft on-board attitude and heading reference system including a magnetometer for correcting a possible drift in the heading measurement, which includes the device (1) specified under claim 15, said device (1) being used to correct the measurement errors of said magnetometer.

18. An aircraft inertial unit associated with a magnetometer, which includes the device (1) specified under claim 15, said device (1) being used to determine the terrestrial magnetic field, in precise fashion, in collaboration with said magnetometer as well as to correct the measurement errors of said magnetometer.

* * * * *

UNITED STATES PATENT AND TRADEMARK OFFICE
CERTIFICATE OF CORRECTION

PATENT NO.   : 5,682,335
DATED        : October 28, 1997
INVENTOR(S)  : Eric Charles and Jean-Paul Petillon It is certified that error appears in the above-identified patent and that said Letters Patent is hereby corrected as shown below:

Column 5,
Line 55, "$\begin{bmatrix} axn & 0 & 0 \\ 0 & ayn & 0 \\ 0 & & azn \end{bmatrix}$" should be --$\begin{bmatrix} axn & 0 & 0 \\ 0 & ayn & 0 \\ 0 & 0 & azn \end{bmatrix}$--.

Column 11,
Line 1, " sin △ " should be --sinΘ--.

Line 2, " cos △·sin" should be --cosΘ·sinΦ--.

Line 3, " cos △·cos" should be --cosΘ·cosΦ--.

Column 13,
Line 50, "$\begin{bmatrix} 0 & -Cez\cdot Fv & Cey\cdot Fh \\ Cez\cdot Fy & 0 & -Cex\cdot Fv \\ -Cey\cdot Fh & Cex\cdot Fv & 0 \end{bmatrix}$" should be --$\begin{bmatrix} 0 & -Cez\cdot Fv & Cey\cdot Fh \\ Cez\cdot Fv & 0 & -Cex\cdot Fv \\ -Cey\cdot Fh & Cex\cdot Fv & 0 \end{bmatrix}$--.

Signed and Sealed this

Ninth Day of April, 2002

*Attest:*

*Attesting Officer*

JAMES E. ROGAN
*Director of the United States Patent and Trademark Office*